(12) United States Patent
Peng et al.

(10) Patent No.: US 8,789,267 B2
(45) Date of Patent: Jul. 29, 2014

(54) CHIP PACKAGING FIXTURE USING MAGNETIC FIELD FOR SELF-ALIGNMENT

(75) Inventors: Jack Zezhong Peng, San Jose, CA (US); David C. Fong, San Jose, CA (US)

(73) Assignee: Chengdu Kiloway Electronics Inc., Chengdu, Sichuan (CN)

( * ) Notice: Subject to any disclaimer, the term of this patent is extended or adjusted under 35 U.S.C. 154(b) by 1133 days.

(21) Appl. No.: 12/765,572

(22) Filed: Apr. 22, 2010

(65) Prior Publication Data

US 2011/0262258 A1    Oct. 27, 2011

(51) Int. Cl.
*B23P 19/00*    (2006.01)

(52) U.S. Cl.
USPC .................. 29/744; 29/740; 29/759; 428/914

(58) Field of Classification Search
USPC ........... 29/739–742, 744, 759, 760, 832, 834, 29/842; 428/914; 438/3, 125
See application file for complete search history.

(56) References Cited

U.S. PATENT DOCUMENTS 3,612,955 A * 10/1971 Butherus et al. .................. 438/3
3,868,764 A *  3/1975 Hartleroad et al. ............. 29/740
6,857,459 B1 *  2/2005 Madrid ......................... 428/914

* cited by examiner

*Primary Examiner* — Donghai D Nguyen
(74) *Attorney, Agent, or Firm* — James Cai; Schein & Cai LLP

(57) ABSTRACT

A method and fixture using magnetic field assisted self-alignment for chip packaging. Typical embodiments include a magnetic device having one or more pole groups, each pole group including two or three poles. Some embodiments provide multiple pole groups arranged in a one or two dimensional pole group array. The poles can build up a self-alignment magnetic field. The structure of fixture is simple and easy to implement. Typical embodiments can greatly reduce chip packaging cost and make packaging more efficient. In accordance with typical embodiments, a chip and a substrate can be self-aligned magnetically regardless of their shapes.

28 Claims, 9 Drawing Sheets

CHIP PACKAGING FIXTURE USING MAGNETIC FIELD FOR SELF-ALIGNMENT

This application is a National stage patent application of PCT application (PCT/CN2007/003042) and claims priority to having a filing date of Oct. 26, 2007, which is incorporated by reference in its entirety.

FIELD OF THE INVENTION

The present invention relates to the packaging of microchips. Some embodiments relate to a self-aligning device for use in micro-chip (RFID tags, diodes, transistors, LED, etc.) bonding point and the substrate bonding point bonding. To this end, these embodiments involves the bond method for use in the self-aligning device.

BACKGROUND OF THE INVENTION

Flip-chip bonding is commonly implemented by conventional micro-chip (such as RFID tag, diodes, transistors, LED etc.) packaging equipment. The device needs to use a robot arm to grab chips, then reverse the arm to make the chip bonding point toward the bonding substrate, then identify the alignment position and control the robotic arm movement aspect, and make a chip and substrate to connect accurately. Because the equipment needs robotic arm and the corresponding control devices, it is very expensive. It also needs to identify, control and grab one chip in one time, so the efficiency is very low.

ALIEN uses conventional FSA (Fluidic Self Assembly) technology to achieve chip and substrate self-alignment, but the method requires the substrate to form openings, the chip shape and size is critical for some applications. Such as RFID tags, the antenna substrate is very thin, so the FSA technology is very difficult and expensive to implement.

SUMMARY OF THE INVENTION

In a class of embodiments, the present invention is a chip packaging fixture configured to use magnetic fields to self-align. It can greatly reduce chip packaging cost and make packaging more efficient. The fixture is very simple and easy to implement. Other embodiments of the present invention relate to methods of using fixtures (e.g., preferred embodiments of the inventive fixtures) to achieve chip and substrate self-aligning bonds.

In an embodiment, the present invention is a chip packaging fixture configured to use magnetic fields to self-align. It comprises a magnetic device, a substrate transfer device, and a chip conveyor. The magnetic device can be or include a permanent magnetic device or an electromagnetic device, and provides a self-alignment magnetic field. It is fixed above the substrate transfer device and has two or three poles. The substrate transfer device comprises two rollers and stepping controller. In operation, transfer device translates one row of substrates. The stepping controller can control the transfer device to ensure that substrate bonding points align to every pole. The chip conveyor can carry multi-chips. It is below the substrate transfer device.

In other embodiments, the present invention is a chip packaging fixture configured to use magnetic fields to self-align, and comprising a magnetic device, a substrate transfer device, and a chip conveyor. The magnetic device provides a self-alignment magnetic field. It is fixed above the substrate transfer device and has a 1×N array of poles, where N is an integer greater than one. The substrate transfer device comprises two rollers and stepping controller. In operation, transfer device translates one row of substrates. The stepping controller can control the transfer device to ensure that N of substrates bonding points align to N of the pole groups. The chip conveyor can carry multi-chips. It is below the substrate transfer device.

In another embodiment, the present invention is a chip packaging fixture configured to use magnetic fields to self-align, and comprising a magnetic device, a substrate transfer device, and a chip conveyor. The magnetic device provides a self-alignment magnetic field. It is fixed above the substrate transfer device and has an array of M×N of poles, where M and N are integers (and typically, each of M and N is greater than one). The substrate transfer device comprises two rollers and stepping controller. In operation, transfer device translates M rows of substrates. The stepping controller can control the transfer device to ensure that M×N of substrates' bonding points align to M×N of pole groups. The chip conveyor can carry M of rows chips. It is below the substrate transfer device.

In some embodiments, the invention relates to a method of using a fixture to achieve a chip and substrate self-aligning bond. The method includes the following steps:
  at least one substrate on a substrate transfer device is positioned with at least one substrate bonding point facing a chip conveyor;
  at least one chip is positioned on the chip conveyor, with at least one chip bonding point facing the substrate transfer device, wherein each said bonding point comprises (e.g., has been treated with) magnetic material;
  control movement of the substrate transfer device and the chip conveyor to achieve a chip and substrate self-aligning bond under magnetic field attraction.

Preferred embodiments of the present invention use the above technological schemes, and therefore have simple structure and are easy to realize. They can improve chip packaging efficiency and reduce cost.

DETAILED DESCRIPTION OF THE INVENTION

In preferred embodiments of the present invention, chip and substrate self-alignment is achieved using the principle of magnetic field attraction. Typically, these embodiments are implemented to be capable of performing self-alignment bonding and connection for bonding points of small chips (e.g., RFID tags, diodes, transistors, LED etc.) and substrates (e.g., bonding antennae for RFID substrates).

Figure 1:
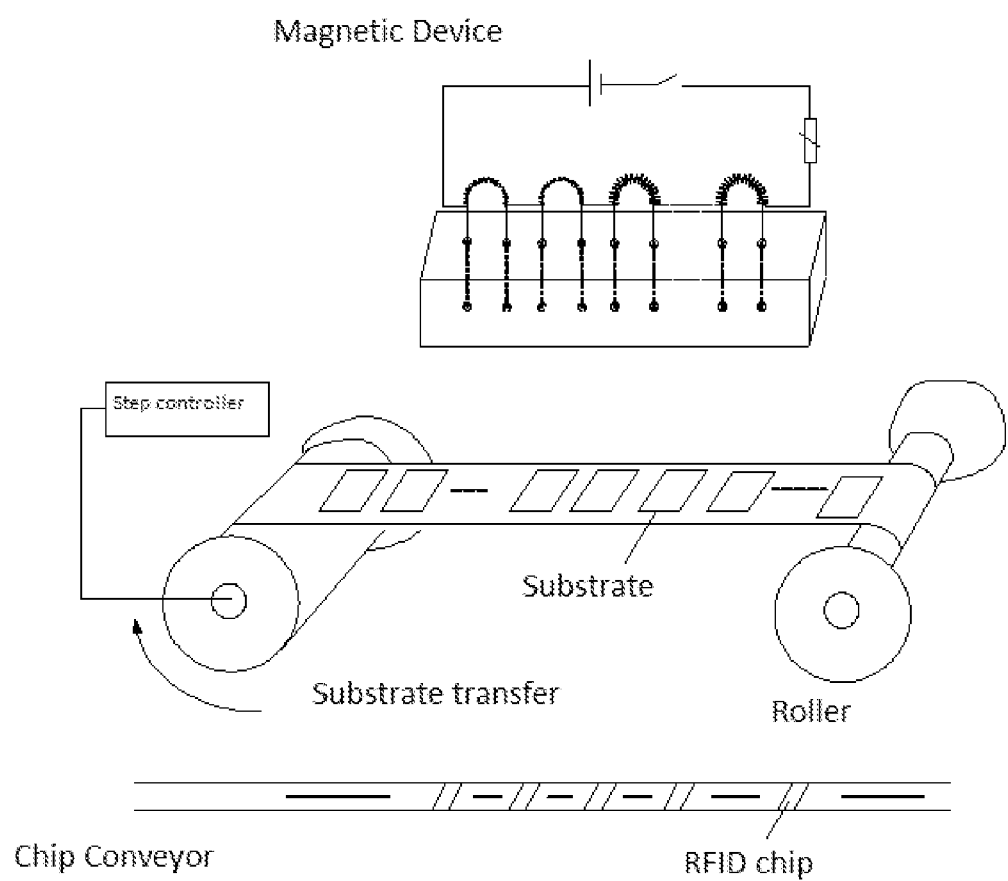
FIG. 1 is a structural diagram of the self-aligning device.

In an embodiment, as shown in FIG. 1, the self-aligning device comprises magnetic device 1, substrate transfer device 2, and one or more chip conveyors 3.

Magnetic device 1 can include one or more magnets arranged to define pole groups (e.g., complex multi-dimensional pole groups) that provide a self-alignment magnetic field. It is fixed above substrate transfer device 2. It can achieve die bonding point and substrate bonding accurate connection in one or more tags packaging process. Each pole group contains two or three poles (according to the desired application). In an embodiment, there are two bonding points on the chip and substrate, and each magnetic pole group includes a pair of opposite magnetic poles. In other embodiments, there are three or more bonding points on the chip and substrate, and each magnetic pole group includes three poles, one of a first magnetic pole polarity and the other two poles of opposite polarity. Of course, a junior engineer in the field can readily design embodiments in which each pole group contains more than three poles given the teaching of this disclosure. Since three points determine a plane, three poles are typically enough for use.

Substrate transfer device 2 comprises two rollers and a stepping controller. In operation, transfer device translates one or more rows of substrates. The stepping controller can control the rollers to ensure that each of one or more substrate bonding points aligns to one or more pole groups. It is important to note that in operation of the substrate transfer device, the substrate bonding points should face downward toward the chip conveyor.

Chip conveyor 3 can carry M rows of chips. It is below substrate transfer device 2. It is important to note that when a chip placed in the chip conveyor, the chip's bonding point(s) must be positioned upward (facing the substrate transfer device). In typical embodiments, every chip bonding point is treated with magnetic material. Optimally the magnetic material is iron film of about 5 μm thickness. Of course, it may be any of a large number of other types (and/or thicknesses) of other magnetic materials. The magnetic film can be implemented by deposition, sputtering. In another optimization of embodiment, strip shaped magnetic film can be placed between the two bonding points. Optimally, the strip shaped magnetic film is iron film of about 5~15 μm thickness. Of course, other magnetic materials may alternatively be used.

The strip shaped magnetic film can be implemented by standard photolithography and wet or dry etching.

In an embodiment, the magnetic device is an electromagnetic device. The electromagnetic device comprises one or more electromagnetic circuits and one or more low permeability objects. The electromagnetic circuit comprises a series or parallel connection solenoids. A high permeability needle is placed in the middle of the solenoids, and one or more groups of needles are arranged in complex multi-dimensional pole groups. By adjusting the solenoids current, one can control the magnetic field intensity. In an embodiment, by adjusting a variable resistor in the main circuit or a subcircuit thereof, we can control the magnetic field intensity. This can prevent the magnetic field from being too small or too strong. Also, in order to turn on and turn off the magnetic field, switches need to be installed in the main circuit or subcircuit.

Low permeability objects should be under the solenoids. One or more holes are made on the low permeability objects. There are an equal number of holes and poles. For focusing the magnetic field, the high permeability needle is placed in the middle of the solenoids. The low permeability object is solid and it is typically made of polymeric, glass, or ceramic. Its bottom is planar so the chip does not lean when the magnetic field attracts the chip.

In the electromagnetic device, by changing the number of electromagnetic circuits and solenoids, or changing the number of solenoids in each electromagnetic circuit and changing their connection or permutation, one can construct a multiform electromagnetic device. The electromagnetic device has one or more pole groups, the pole groups have an arrangement in one or two dimensions that is preferably chosen to improve chip packaging efficiency.

Next, we provide a detailed description of specific embodiments of the inventive fixture and method.

Figure 2A:
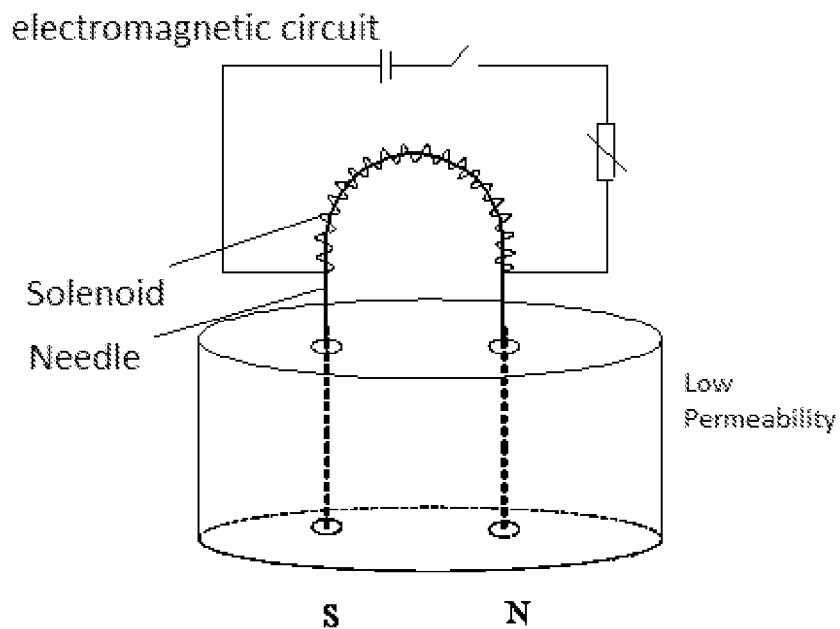
FIG. 2a is a structural diagram of an embodiment of an electromagnetic device with two poles.

A first embodiment of the electromagnetic device is shown in FIG. 2a. This embodiment, suitable for use when each of the chip and substrate has two bonding points, comprises an electromagnetic circuit and a low permeability object. A solenoid (and high permeability needle extending through it) is connected serially in the electromagnetic circuit, with the ends of the needle aligned with holes in the low permeability object. There are two holes in the low permeability object.

Figure 2B:
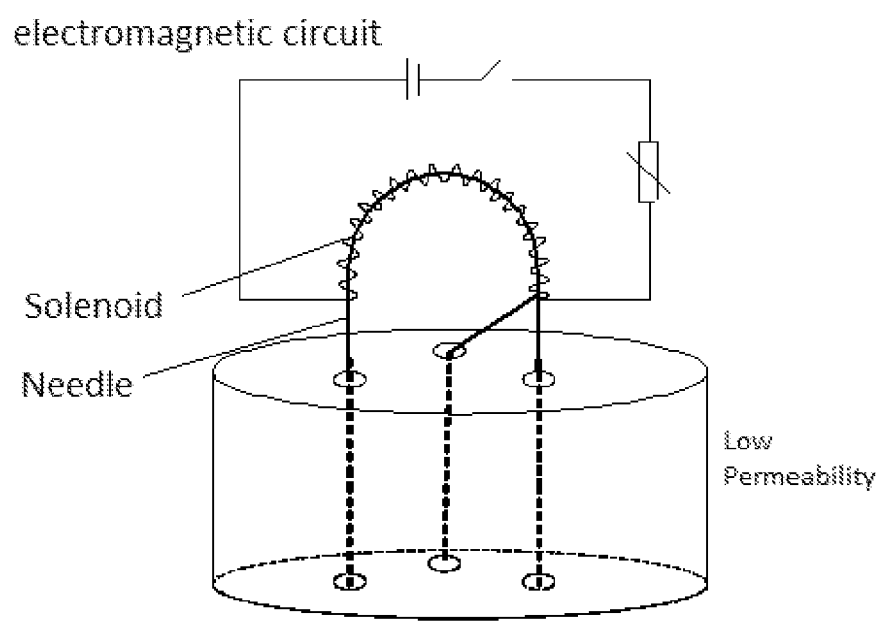
FIG. 2b is a structural diagram of an embodiment of an electromagnetic device with three poles.

A second embodiment of the electromagnetic device is shown in FIG. 2b. This embodiment, suitable for use when each of the chip and substrate has three bonding points, comprises an electromagnetic circuit and a low permeability object. A solenoid (with two high permeability needles extending at least partially through it) is connected serially in the electromagnetic circuit with the ends of the needle aligned with holes in the low permeability object. There are three holes in the low permeability object. Two needles extend out from one end of the solenoid.

Figure 3:
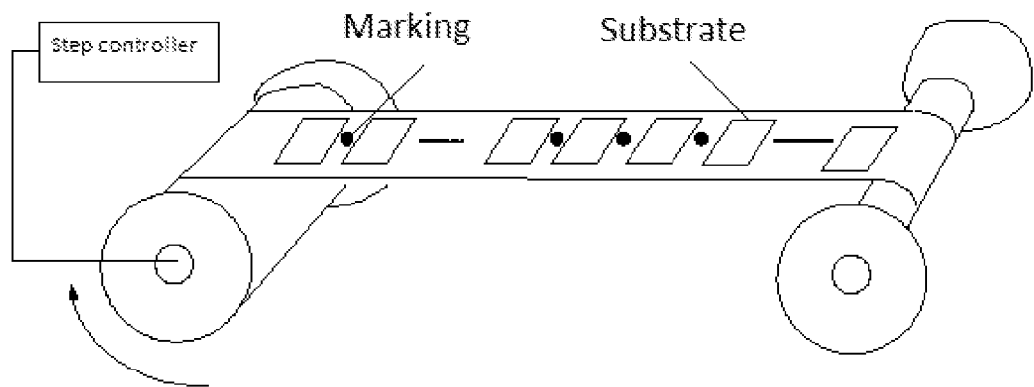
FIG. 3 is a structural diagram of an embodiment of the substrate transfer device according to the present invention.
Figure 4A:
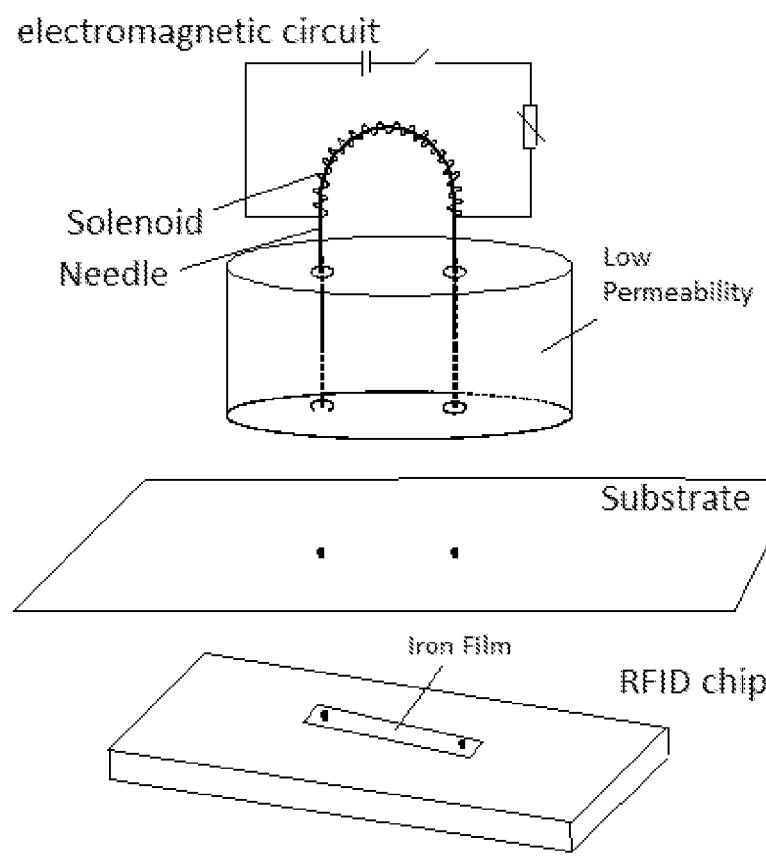
FIG. 4a-4b is a diagram of an embodiment of chip and substrate's bonding point self-aligning bond implemented with the self-aligning device according to the present invention.
Figure 4B:
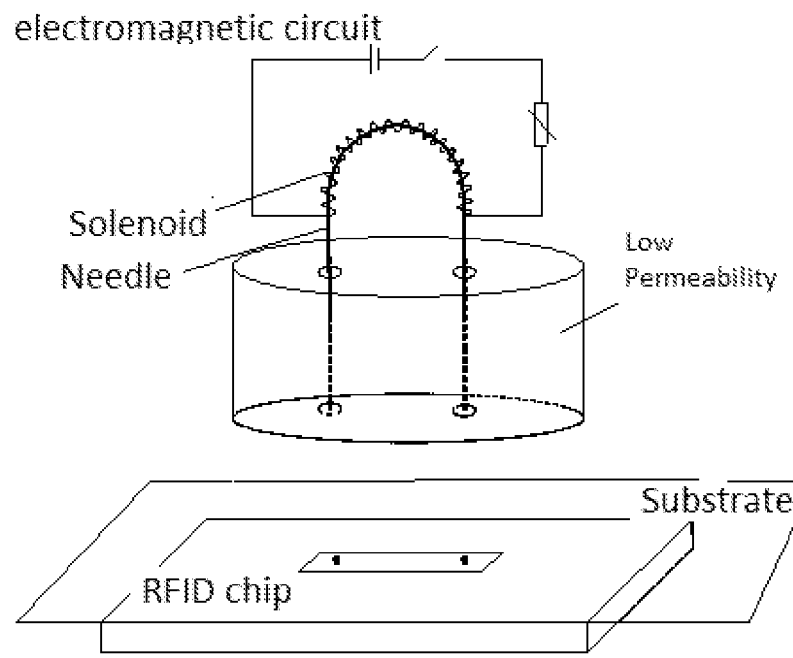

In the embodiment shown in FIG. 3, the substrate transfer device includes a substrate belt on rollers for translating one row of substrates past an electromagnetic device (e.g., that of FIG. 2a or 2b). There are markings 4 on the substrate belt. The markings 4 are used to control a stepping motor, to correctly position substrate bonding points and magnetic poles. As is shown in FIG. 4a and FIG. 4b, self-alignment is successful when two substrate bonding points (of a substrate on the substrate belt) are aligned with high permeability needle ends of the electromagnetic device, and with two bonding points of a chip on a chip conveyor below the substrate belt.

Figure 5A:
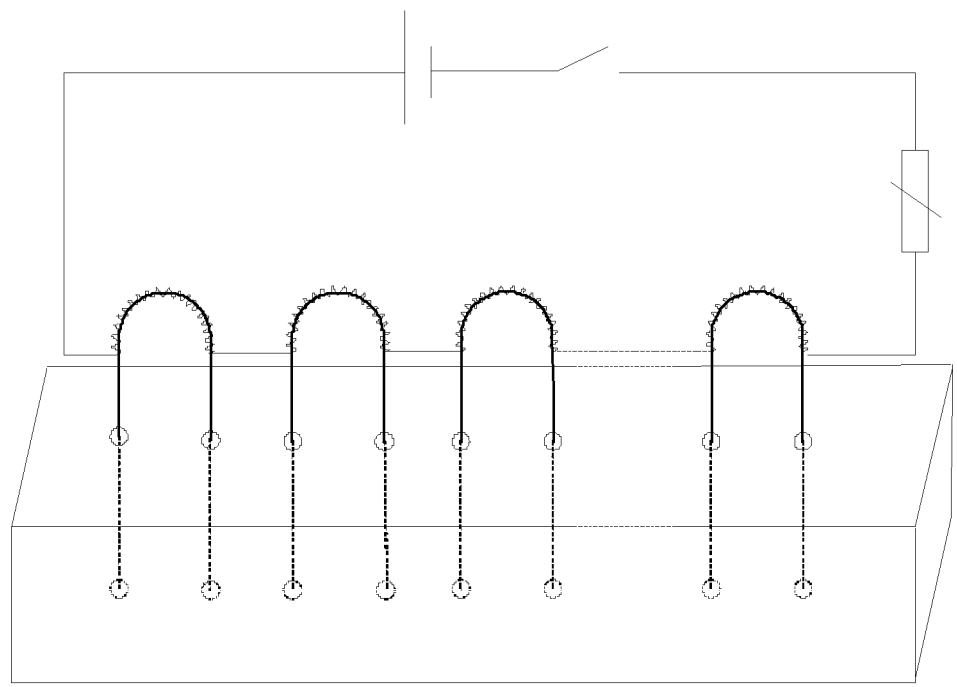
FIG. 5a is a structural diagram of an embodiment of an electromagnetic device with 1×N of array pole groups of two poles.
Figure 5B:
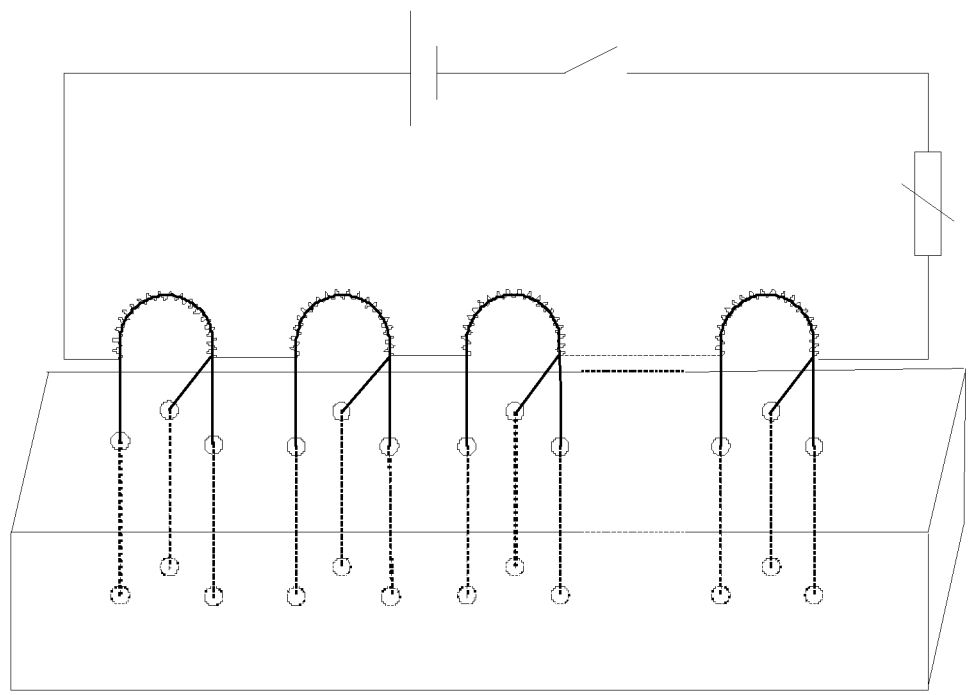
FIG. 5b is a structural diagram of an embodiment of an electromagnetic device with 1×N of array pole groups of three poles.
Figure 6A:
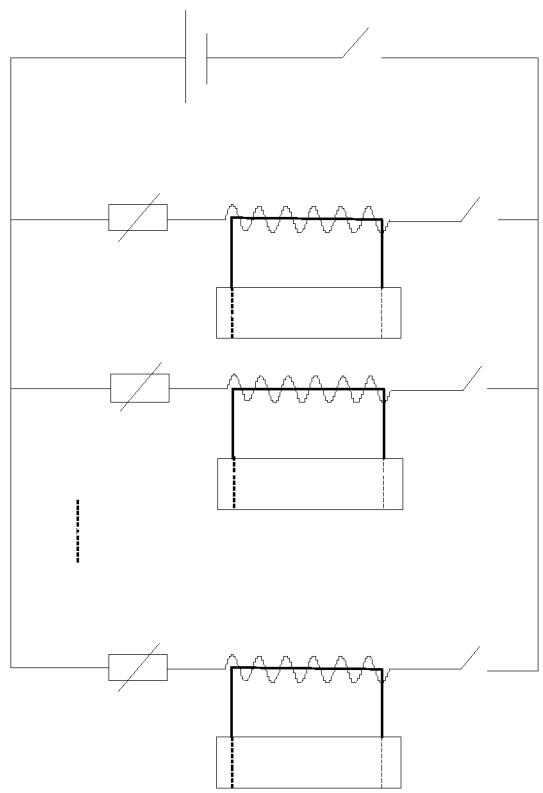
FIG. 6a is a structural diagram of another embodiment of an electromagnetic device with 1×N of array pole groups of two poles.
Figure 6B:
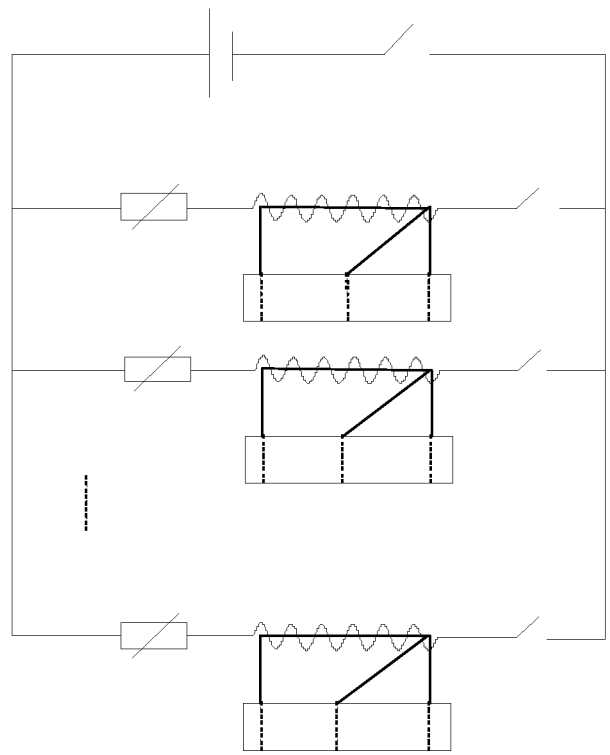
FIG. 6b is a structural diagram of another embodiment of an electromagnetic device with 1×N of array pole groups of three poles.

In other embodiments, as shown in FIG. 5a and FIG. 5b, the electromagnetic device is designed to include two or more pole groups, and the pole groups are regularly positioned in a one dimension array. This allows alignment of more chips at the same time to improve packaging efficiency. For each pole group, there are two or three holes in the low permeability object positioned below solenoids of the electromagnetic circuit. There are two holes in the low permeability object per pole group in FIG. 5a and three holes in the low permeability object per pole group in FIG. 5b. The low permeability object can be divided into many parts, so it can decrease EMI (Electro-magnetic Interference) and improve the flexibility of the packing apparatus.

As is shown in FIGS. 5a, 5b, 6a, and 6b, by adjusting one or more variable resistors 5 in the main electromagnetic circuit (or a subcircuit thereof) of the electromagnetic device of the inventive apparatus, one can control the magnetic field intensity. In order to turn on and turn off the magnetic field, one or more switches 6 need to be installed in the main circuit or subcircuit.

Figure 7A:
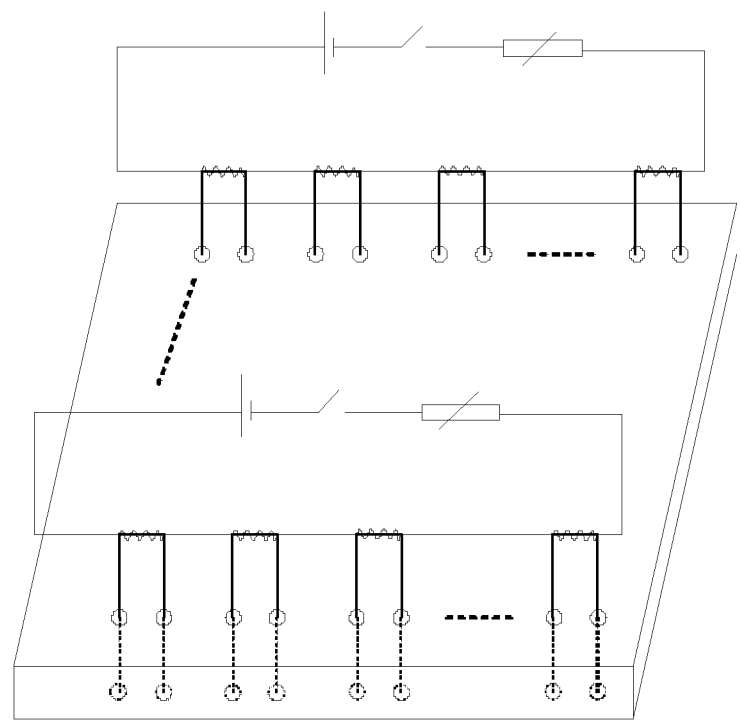
FIG. 7a is a structural diagram of an embodiment of an electromagnetic device with M×N of array pole groups of two poles.
Figure 7B:
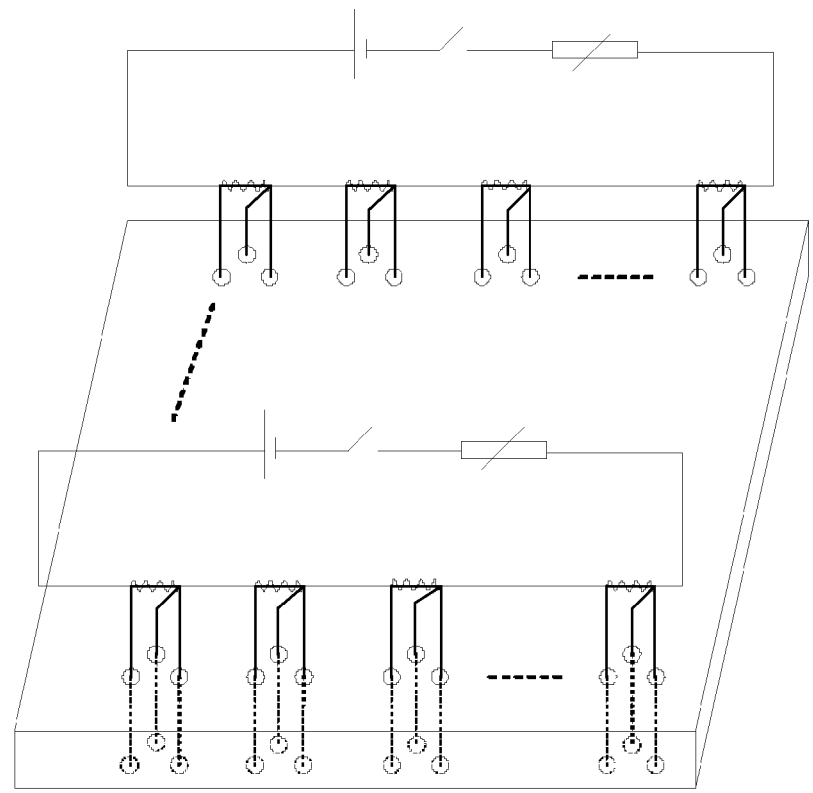
FIG. 7b is a structural diagram of an embodiment of an electromagnetic device with M×N of array pole groups of two poles.
Figure 8:
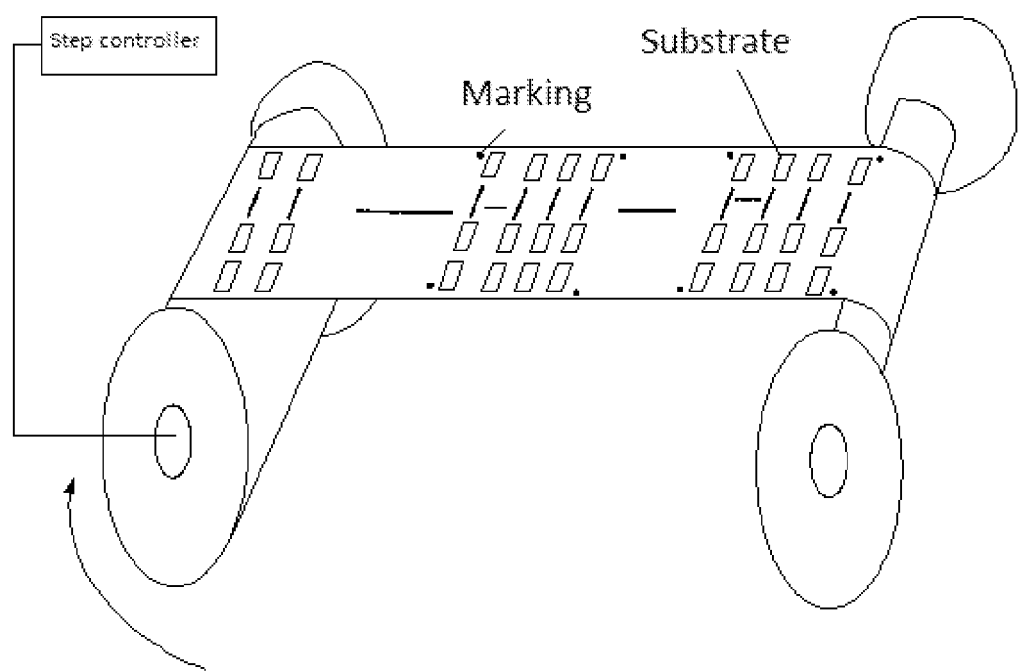
FIG. 8 is a structural diagram of another embodiment of the substrate transfer device according to the present invention.

As is shown in FIG. 7a and FIG. 7b, some embodiments of the electromagnetic device of the inventive device are designed to include more than two pole groups 7, and the pole groups are regularly positioned in a two dimensional arranged array. There are two or three holes in a low permeability object 8 (positioned below the electromagnetic circuit of the device) for each pole group 7. As shown in FIG. 8, a substrate transfer device which (in operation) translates multiple rows 14 of substrates would typically be positioned below the two-dimensional array of pole groups of the electromagnetic device.

Figure 9A:
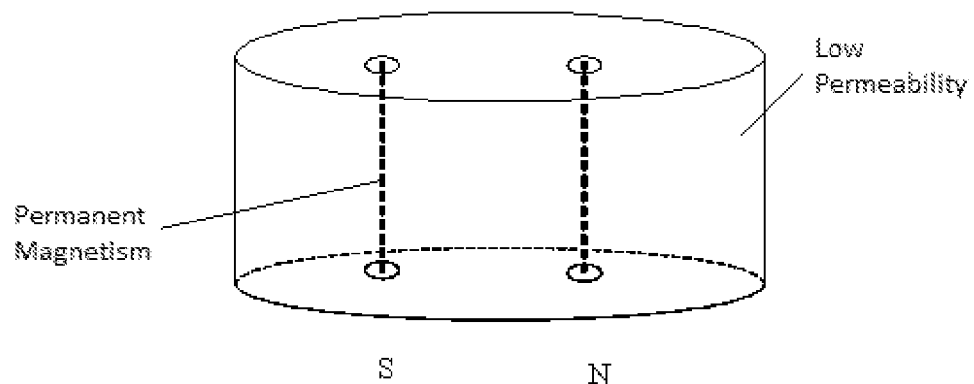
FIG. 9a is a structural diagram of an embodiment of a permanent magnet device with two poles.
Figure 9B:
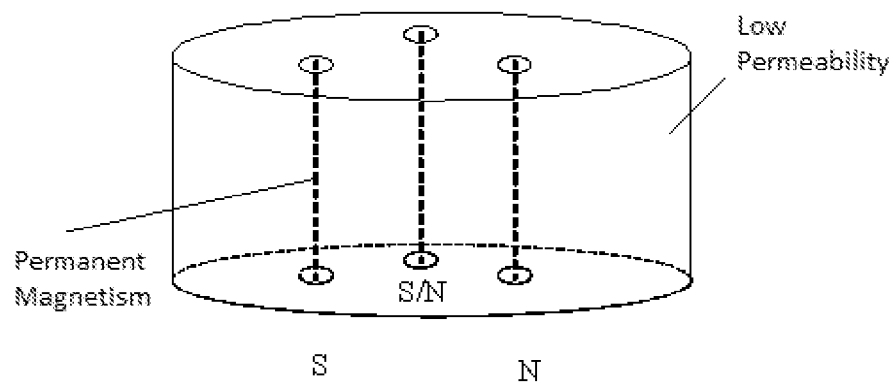
FIG. 9b is a structural diagram of an embodiment of a permanent magnet device with three poles.
Figure 10A:
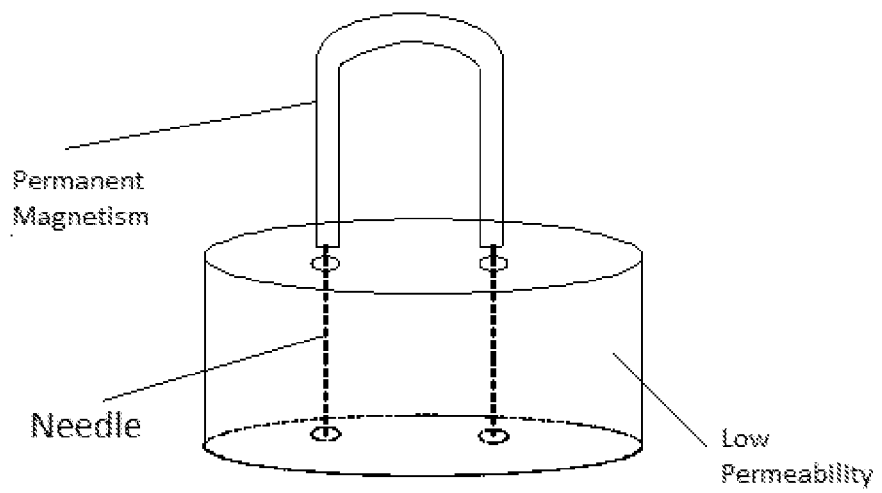
FIG. 10a is a structural diagram of another embodiment of a permanent magnet device with two poles.
Figure 10B:
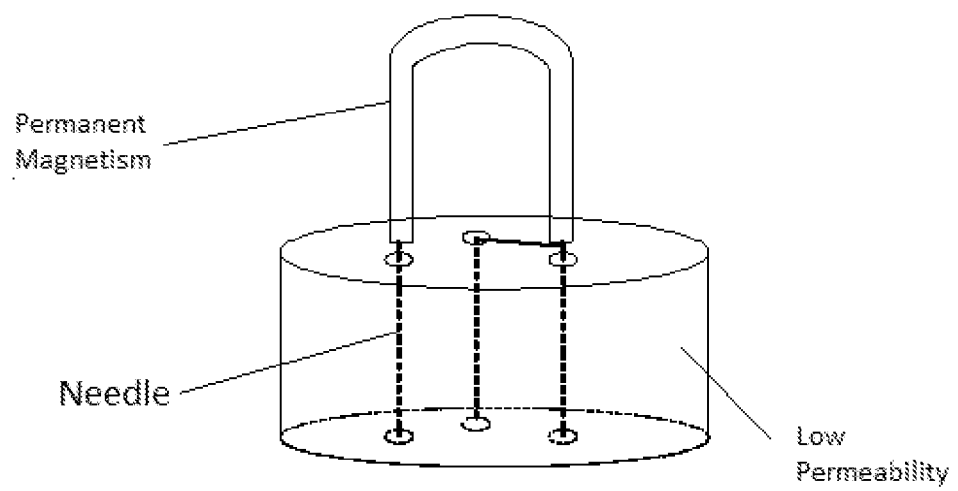
FIG. 10b is a structural diagram of another embodiment of a permanent magnet device with three poles.

In other embodiments, the electromagnetic device of the inventive apparatus is or includes a permanent magnetic device (rather than an electromagnetic device). The permanent magnetic device comprises one or more permanent magnets (e.g., permanent magnet 10 of FIG. 10a or 10b) and a low permeability object (e.g., permanent magnet 9 of FIGS. 9a and 10a, or permanent magnet 9' of FIGS. 9b and 10b) positioned near the magnet(s). There can be two or three holes through the low permeability object, or more than one group of holes (each group comprising two or three holes). A permanent magnet can be mounted with a pole facing each of some or all of the holes in each group, as shown in FIGS. 10a and 10b (in which magnet 10 is positioned with poles above a single group of holes 11 of object 9 or 9'). The permanent magnetic device is designed to provide one or more pole groups (the device of FIG. 10a or FIG. 10b provides a single pole group), and the pole groups can be regularly positioned in a one or two dimensional arranged array.

Any of the substrate transfer devices described herein, and any of the electromagnetic device described herein for use with each such substrate transfer device, can be used in various embodiments of the inventive packaging fixture, are the same.

In some embodiments of the invention, in order to achieve improved substrate and chip connection, each bonding point on the substrate may be treated with conductive glue. Of course, the connection can be made in any of many other ways that will be apparent to an ordinarily skilled engineer in the field given the teaching of this disclosure.

Although the present invention has been described above with reference to preferred embodiments, those skilled in the art will readily appreciate that various modifications and improvements of the described embodiments can be implemented without departing from the spirit and scope of the invention as defined by the claims of this application.

What is claimed is:

1. A chip packaging fixture configured to use a magnetic field for self-alignment, said fixture including:

a magnetic device which provides a self-alignment magnetic field;

a substrate transfer device positioned within the magnetic field provided by the magnetic device, and configured to translate at least one row of substrates, wherein the magnetic device is positioned adjacent to the substrate transfer device and defines at least one magnetic pole group, each said magnetic pole group including not less than two poles and not more than three poles; and a chip conveyor positioned within the magnetic field provided by the magnetic device, and configured to translate at least one row of chip elements, whereby the magnetic field can align each of at least a subset of the substrates translated by the substrate transfer device with a corresponding one of the chip elements translated by the chip conveyor.

2. The fixture of claim 1, wherein the substrate transfer device comprises two rollers, a substrate translation element coupled to the rollers and configured to support the substrates, and a stepping controller coupled and configured to control translation of the substrate translation element by the rollers, wherein the substrate transfer device is configured to ensure that each substrate bonding point can align with at least one said magnetic pole group.

3. The fixture of claim 2, wherein the chip conveyor is configured to translate multi-chips, and the substrate transfer device is positioned between the chip conveyor and the magnetic device.

4. The fixture of claim 2, wherein the substrate transfer device includes a substrate belt and inductive markings at intervals along the substrate belt, and wherein the stepping controller is configured to sense the inductive markings.

5. The fixture of claim 1, wherein the magnetic device is a permanent magnetic device comprising at least one permanent magnet, a low permeability object positioned adjacent to the at least one permanent magnet, and at least one permeability needle, and wherein the low permeability object defines not less than two holes and not less three holes for each said permanent magnet, each of at least a subset of the holes receives one said permeability needle, whereby the permanent magnetic device magnetizes each said permeability needle.

6. The fixture of claim 1, wherein the magnetic device provides magnetic pole groups arranged in a 1×N array, where N is an integer greater than one.

7. The fixture of claim 6, wherein the substrate transfer device comprises two rollers, a substrate translation element coupled to the rollers and configured to support the substrates, and a stepping controller coupled and configured to control translation of the substrate translation element by the rollers, wherein the substrate transfer device is configured to ensure that each of N substrate bonding points of substrates translated by the substrate transfer device can align with N of the magnetic pole groups.

8. The fixture of claim 6, wherein each of the magnetic pole groups includes not less than two poles and not more than three poles.

9. The fixture of claim 6, wherein the magnetic device is an electromagnetic device comprising an electromagnetic circuit and a low permeability object positioned adjacent to the electromagnetic circuit, wherein the electromagnetic circuit comprises at least one solenoid, at least one high permeability needle positioned at least partially in each said solenoid, and the low permeability object defines not less than two holes and not less three holes, each of the holes positioned to receive an end of one said needle.

10. The fixture of claim 9, wherein the electromagnetic circuit includes at least one variable resistor coupled to at least one said solenoid.

11. The fixture of claim 9, wherein the electromagnetic circuit includes at least one switch.

12. The fixture of claim 6, wherein the magnetic device is a permanent magnetic device.

13. The fixture of claim 12, wherein the permanent magnetic device comprises at least one permanent magnet and a low permeability object positioned adjacent to the at least one permanent magnet, and the low permeability object defines not less than two holes and not less three holes for each said permanent magnet, each of at least a subset of the holes positioned adjacent to a pole of the magnet.

14. The fixture of claim 12, wherein the permanent magnetic device comprises at least one permanent magnet and a low permeability object positioned adjacent to the at least one permanent magnet, and at least one group of holes extends through the low permeability object for each said permanent magnet, wherein each said group of holes forms one of the magnetic pole groups.

15. The fixture of claim 1, wherein the magnetic device provides magnetic pole groups arranged in an M×N array, where M and N are integers.

16. The fixture of claim 15, wherein the substrate transfer device comprises two rollers, a substrate translation element coupled to the rollers and configured to support the substrates, and a stepping controller coupled and configured to control translation of the substrate translation element by the rollers, wherein the substrate transfer device is configured to ensure that each of a set of M×N substrate bonding points of substrates translated by the substrate transfer device can align with the M×N array of the magnetic pole groups.

17. The fixture of claim 15, wherein each of the magnetic pole groups includes not less than two poles and not more than three poles.

18. The fixture of claim 15, wherein the magnetic device is an electromagnetic device comprising an electromagnetic circuit and a low permeability object positioned adjacent to the electromagnetic circuit, wherein the electromagnetic circuit comprises at least one solenoid, at least one high permeability needle positioned at least partially in each said solenoid, and the low permeability object defines not less than two holes and not less three holes, each of the holes positioned to receive an end of one said needle.

19. The fixture of claim 18, wherein the electromagnetic circuit includes at least one variable resistor coupled to at least one said solenoid.

20. The fixture of claim 18, wherein the electromagnetic circuit includes at least one switch.

21. The fixture of claim 15, wherein the magnetic device is a permanent magnetic device.

22. The fixture of claim 21, wherein the permanent magnetic device comprises at least one permanent magnet and a low permeability object positioned adjacent to the at least one permanent magnet, and the low permeability object defines not less than two holes and not less three holes for each said permanent magnet, each of at least a subset of the holes positioned adjacent to a pole of the magnet.

23. The fixture of claim 15, wherein the substrate transfer device includes a substrate belt and a set of inductive markings at intervals along the substrate belt, and wherein the stepping controller is configured to sense the inductive markings.

24. The fixture of claim 23, wherein each said set of inductive markings includes at least four inductive markings at intervals of M×N of substrates on the substrate belt.

25. A chip packaging fixture configured to use a magnetic field for self-alignment, said fixture including:
- a magnetic device which provides a self-alignment magnetic field;
- a substrate transfer device positioned within the magnetic field provided by the magnetic device, and configured to translate at least one row of substrates, wherein the magnetic device is an electromagnetic device comprising an electromagnetic circuit and a low permeability object positioned adjacent to the electromagnetic circuit, wherein the electromagnetic circuit comprises at least one solenoid, at least one high permeability needle positioned at least partially in each said solenoid, and the low permeability object defines not less than two holes and not less three holes, each of the holes positioned to receive an end of one said needle; and
- a chip conveyor positioned within the magnetic field provided by the magnetic device, and configured to translate at least one row of chip elements, whereby the magnetic field can align each of at least a subset of the substrates translated by the substrate transfer device with a corresponding one of the chip elements translated by the chip conveyor.

26. The fixture of claim 25, wherein the electromagnetic circuit includes at least one variable resistor coupled to at least one said solenoid.

27. The fixture of claim 25, wherein the electromagnetic circuit includes at least one switch.

28. A chip packaging fixture configured to use a magnetic field for self-alignment, said fixture including:
- a magnetic device which provides a self-alignment magnetic field;
- a substrate transfer device positioned within the magnetic field provided by the magnetic device, and configured to translate at least one row of substrates, wherein the magnetic device is a permanent magnetic device comprising at least one permanent magnet and a low permeability object positioned adjacent to the at least one permanent magnet, and the low permeability object defines not less than two holes and not less three holes for each said permanent magnet, each of at least a subset of the holes positioned adjacent to a pole of the magnet; and
- a chip conveyor positioned within the magnetic field provided by the magnetic device, and configured to translate at least one row of chip elements, whereby the magnetic field can align each of at least a subset of the substrates translated by the substrate transfer device with a corresponding one of the chip elements translated by the chip conveyor.

* * * * *